(12) United States Patent
Ismail

(10) Patent No.: US 7,088,985 B2
(45) Date of Patent: Aug. 8, 2006

(54) LOW-NOISE FILTER FOR A WIRELESS RECEIVER

(75) Inventor: Aly M. Ismail, Costa Mesa, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 37 days.

(21) Appl. No.: 10/715,631

(22) Filed: Nov. 18, 2003

(65) Prior Publication Data

US 2005/0107064 A1    May 19, 2005

(51) Int. Cl.
*H04B 1/16* (2006.01)

(52) U.S. Cl. .................. 455/339; 455/296; 455/307; 455/334

(58) Field of Classification Search ........ 455/332–341, 455/323–330, 114, 295–296, 302, 313–319, 455/73–84, 114.2, 550.1, 575.1, 130, 195.1, 455/190.1, 207, 262, 290, 306–307, 90.3; 327/552–558; 333/217; 330/107–109, 303
See application file for complete search history.

(56) References Cited

U.S. PATENT DOCUMENTS

| | | | | |
|---|---|---|---|---|
| 3,984,639 A | * | 10/1976 | McGuire | 370/488 |
| 4,001,735 A | * | 1/1977 | Cheng et al. | 333/213 |
| 4,015,220 A | | 3/1977 | Kaufman | |
| 4,185,250 A | * | 1/1980 | Regan | 330/107 |
| 4,686,486 A | * | 8/1987 | Greaves et al. | 330/107 |
| 5,182,522 A | * | 1/1993 | Tanigawa et al. | 327/552 |
| 5,327,580 A | * | 7/1994 | Vignali et al. | 455/701 |
| 5,862,212 A | | 1/1999 | Mathews | |
| 6,008,691 A | * | 12/1999 | Morita | 327/552 |
| 2001/0019608 A1 | * | 9/2001 | Lofmark | 379/398 |
| 2003/0203726 A1 | | 10/2003 | Kluge et al. | |
| 2004/0048594 A1 | | 3/2004 | Okanobu | |

* cited by examiner

*Primary Examiner*—Pablo N. Tran
(74) *Attorney, Agent, or Firm*—Smith Frohwein Tempel Greenlee Blaha LLC

(57) ABSTRACT

A low-noise filter for a wireless receiver is disclosed. The low-noise filter comprises an amplifier and a filter comprising a frequency dependent negative resistance implemented using a general impedance converter to realize a bi-quad filter. The low-noise filter is implemented such that noise generated by the filter when an in-band signal is processed is prevented from appearing at the output of the amplifier stage.

19 Claims, 3 Drawing Sheets

LOW-NOISE FILTER FOR A WIRELESS RECEIVER

BACKGROUND OF THE INVENTION

1. Field of the Invention

This invention relates generally to receiver circuit architecture in a wireless portable communication device. More particularly, the invention relates to a low-noise filter in a wireless receiver.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld, telephone-like communication handset. The different modulation and transmission schemes each have advantages and disadvantages.

As these mobile communication systems have been developed and deployed, many different standards, to which these systems must conform, have evolved. For example, in the United States, third generation portable communications systems comply with the IS-136 standard, which requires the use of a particular modulation scheme and access format. In the case of IS-136, the modulation scheme can be 8-quadrature phase shift keying (8QPSK), offset $\pi/4$ differential quadrature phase shift keying ($\pi/4$-DQPSK) or variations thereof and the access format is TDMA.

In Europe, the global system for mobile communications (GSM) standard requires the use of the gaussian minimum shift keying (GMSK) modulation scheme in a narrow band TDMA access environment, which uses a constant envelope modulation methodology.

Furthermore, in a typical GSM mobile communication system using narrow band TDMA technology, a GMSK modulation scheme supplies a very low noise phase modulated (PM) transmit signal to a non-linear power amplifier directly from an oscillator. In such an arrangement, a non-linear power amplifier, which is highly efficient, can be used thus allowing efficient modulation of the phase-modulated signal and minimizing power consumption. Because the modulated signal is supplied directly from an oscillator, the need for filtering, either before or after the power amplifier, is minimized. Further, the output in a GSM transceiver is a constant envelope (i.e., a non time-varying signal containing only a phase modulated (PM) signal) modulation signal.

One of the advances in portable communication technology is the move toward the implementation of a low intermediate frequency (IF) receiver and a direct conversion receiver (DCR). A low IF receiver converts a radio frequency (RF) signal to an intermediate frequency that is lower than the IF of a convention receiver. A direct conversion receiver downconverts a radio frequency (RF) received signal directly to baseband (DC) without first converting the RF signal to an intermediate frequency (IF). One of the benefits of a direct conversion receiver is the elimination of costly filter components used in systems that employ an intermediate frequency conversion. For example, in a conventional code division multiple access (CDMA) communication system, one or more surface acoustic wave (SAW) filters are implemented to aid in converting the RF signal to an IF signal. To further complicate the circuitry, these SAW filters are typically located on a different device (i.e., "off-chip") than many of the receiver components.

A low IF or a direct conversion receiver allows the filter components to be implemented using electronic circuitry that can be located on the same device (i.e., "on-chip") as many of the receiver components. In a direct conversion receiver implementation, high-order (e.g., fifth-order or higher) active filters are used to convert the received signal from RF to DC. Unfortunately, because the filters are implemented using electronic circuitry on the same chip as the receiver components, the filter adds significant noise to the received signal. The added noise reduces the sensitivity of the receiver, thereby making such an active filter challenging to implement.

Noise contributed by a filter to the received signal can be defined by the equation Noise=kC/T (Equation 1), where k is a constant, T=temperature, and C=capacitance. From equation 1 it is clear that the noise is inversely proportional to the capacitance. To reduce the noise, the capacitance should be increased. Unfortunately, increasing the capacitance consumes valuable area on the chip on which the receiver is fabricated.

Therefore, it would be desirable to minimize the amount of noise contributed to a received signal by filter components in a direct conversion receiver, while maximizing receiver sensitivity. It is also desirable to minimize the amount of area on a device consumed by the filter components.

SUMMARY

Embodiments of the invention include a low-noise filter for a wireless receiver, comprising an amplifier and a filter comprising a frequency dependent negative resistance implemented using a general impedance converter to realize a bi-quad filter. The low-noise filter is implemented such that noise generated by the filter when an in-band signal is processed is prevented from appearing at the output of the amplifier stage.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the low-noise filter can be implemented in any communication device employing a low IF or a direct conversion receiver.

Furthermore, the low-noise filter can be implemented to operate in different modes to support multiple wireless standards. To support multiple wireless standards, the components to be described below (e.g., the resistors and capacitors used in the low-noise filter) will be designed to switch between the different modes of operation. The control circuitry in such an implementation can be implemented using specialized hardware elements and logic. The software portion can be stored in the memory and be executed by a suitable instruction execution system (i.e., a microprocessor).

The hardware implementation of the low-noise filter can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the low-noise filter comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
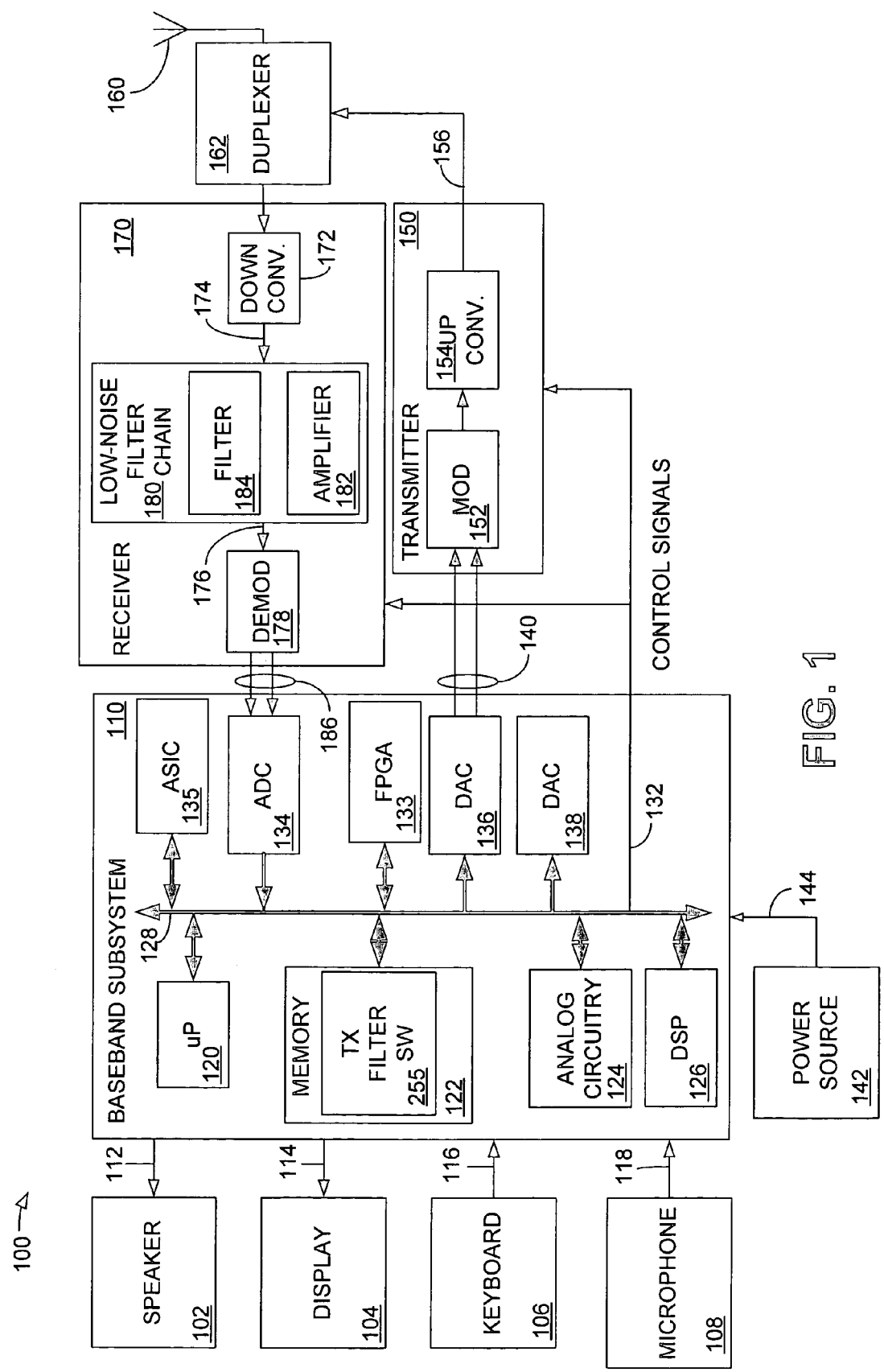
FIG. 1 is a block diagram illustrating a simplified portable transceiver including a filter chain in accordance with the invention.

FIG. 1 is a block diagram illustrating a simplified portable transceiver 100 including a low-noise filter for a direct conversion receiver. Portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication handset such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (µP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

In one embodiment, depending on the manner in which the low-noise filter to be described below is implemented, the baseband subsystem 110 may also include an application specific integrated circuit (ASIC) 135 and a field programmable gate array (FPGA) 133.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150 and receiver 170 via connection 132. Although shown as a single connection 132, the control signals may originate from the DSP 126, the ASIC 135, the FPGA 133, or from microprocessor 120, and are supplied to a variety of connections within the transmitter 150 and the receiver 170. It should be noted that, for simplicity, only the basic components of portable transceiver 100 are illustrated herein. The control signals provided by the baseband subsystem 110 control the various components within the transmitter 150 and the receiver 170.

If the low-noise filter control is implemented wholly or partially in software that is executed by the microprocessor 120, the memory 122 will also include the low-noise filter software 255. The low-noise filter software 255 comprises one or more executable code segments that can be stored in the memory and executed in the microprocessor 120. Alternatively, the functionality of the low-noise filter software 255 can be coded into the ASIC 135 or can be executed by the FPGA 133. Because the memory 122 can be rewritable and because the FPGA 133 is reprogrammable, updates to the low-noise filter software 255 can be remotely sent to and saved in the portable transceiver 100 when implemented using either of these methodologies.

Baseband subsystem 110 also includes analog-to-digital converter (ADC) 134 and digital-to-analog converters (DACs) 136 and 138. Although DACs 136 and 138 are illustrated as two separate devices, it is understood that a single digital-to-analog converter may be used that performs the function of DACs 136 and 138. ADC 134, DAC 136 and DAC 138 may also communicate with microprocessor 120, memory 122, analog circuitry 124 and DSP 126 via bus 128. DAC 136 converts the digital communication information within baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

The transmitter 150 includes modulator 152, which modulates the analog information in connection 140 and provides a modulated signal via connection 158 to upconverter 154. The upconverter 154 transforms and amplifies the modulated signal on connection 158 to an appropriate transmit frequency and power level for the system in which the portable transceiver 100 is designed to operate. Details of the modulator 152 and the upconverter 154 have been omitted for simplicity, as they will be understood by those skilled in the art. For example, the data on connection 140 is generally formatted by the baseband subsystem 110 into in-phase (I) and quadrature (Q) components. The I and Q components may take different forms and be formatted differently depending upon the communication standard being employed.

The upconverter 154 supplies the upconverted signal via connection 156 to duplexer 162. The duplexer comprises a filter pair that allows simultaneous passage of both transmit signals and receive signals, as known to those having ordinary skill in the art. The transmit signal is supplied from the duplexer 164 to the antenna 160.

A signal received by antenna 160 will be directed from the duplexer 162 to the receiver 170. The receiver 170 includes a downconverter 172, a low-noise filter chain 180 constructed in accordance with an aspect of the invention, and a demodulator 178. The downconverter 172 includes a low-noise amplifier (LNA) (not shown) and circuitry (not shown) to convert the received signal from an RF level to a baseband level (DC). The DC level signal is sent to the low-noise filter chain 180 via connection 174. The low-noise filter chain comprises at least one filter stage comprising an amplifier 182 and a filter 184. The operation of the amplifier 182 and the filter 184 will be described in detail below.

The demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing.

Figure 2:
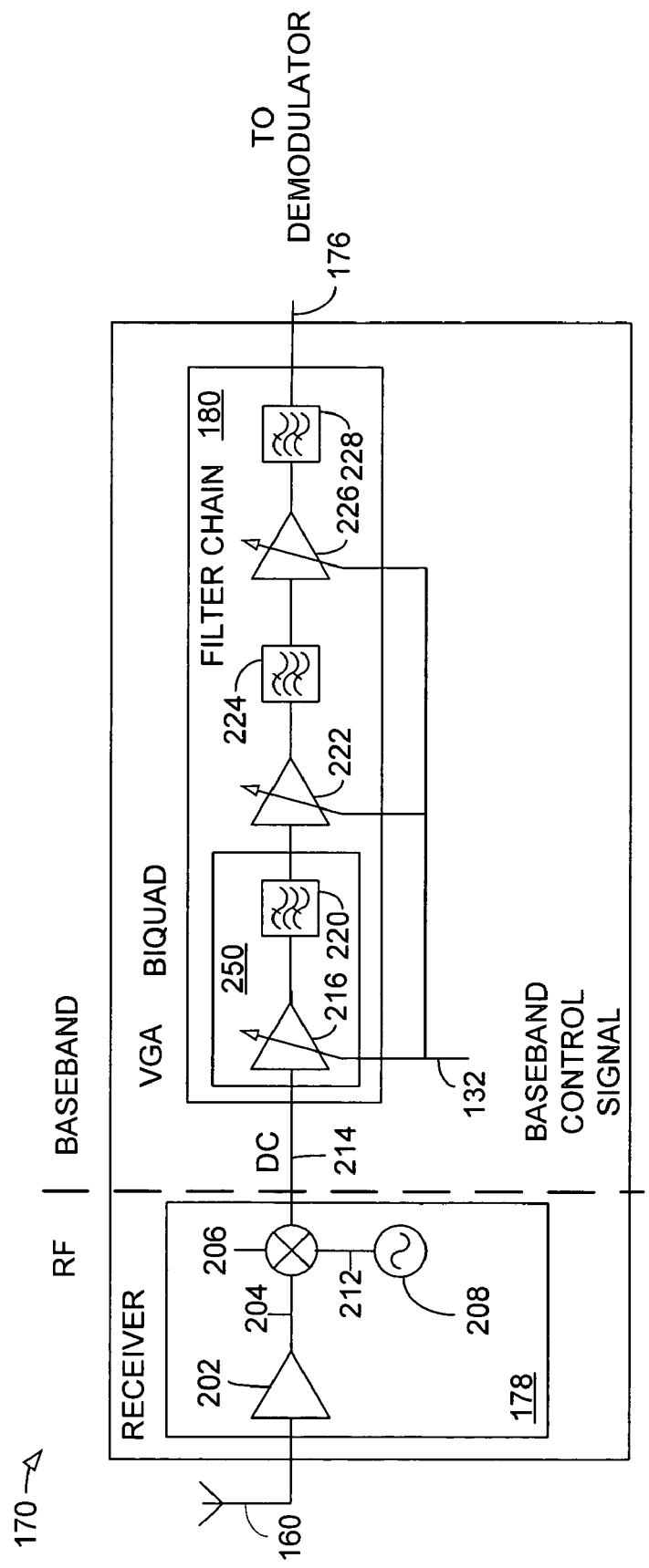
FIG. 2 is a block diagram illustrating the receiver of FIG. 1.

FIG. 2 is a block diagram illustrating, in greater detail, the receiver 170 of FIG. 1. The receiver 170 receives a signal via antenna 160, which supplies the received signal at an RF frequency level via the duplexer (not shown) to low noise amplifier (LNA) 202. The LNA 202 amplifies the received signal and provides the amplified signal on connection 204 to the mixer 206. The mixer 206 receives a frequency reference signal, also called a "local oscillator" signal, or "LO," from a synthesizer 208, via connection 212. The LO signal determines the frequency to which the mixer 206 downconverts the signal received from LNA 202 via connection 204. In the case of a direct conversion receiver, the mixer 206 downconverts the received RF signal to a DC signal on connection 214.

The DC signal on connection 214 is then supplied to the low-noise filter chain 180. The low-noise filter chain 180 comprises at least one filter stage 250. The filter stage 250 comprises a variable gain amplifier (VGA) 216 and a filter 220. The filter 220 can be referred to as a so-called "bi-quad" filter because of it's configuration to generate complex poles and zeros. A conventional bi-quad implementation typically uses feedback and feed-forward terms around two analog integrators to generate the pair of complex poles and zeros. The amplifier 216 and the filter 220 represent the amplifier 182 and the filter 184, respectively, of FIG. 1. Although illustrated using a plurality of amplifiers and filters, the low-noise filter chain 180 may comprise a single filter stage, depending upon the specific application in which the receiver 170 is used.

The DC signal on connection 214 is supplied to variable gain amplifier 216. The variable gain amplifier 216 receives a control signal via connection 132 from the baseband subsystem 110 (FIG. 1). The variable gain amplifier 216 amplifies the signal on connection 214, and supplies the amplified signal to the filter 220. The filter 220 filters the signal to provide the desired signal output. If the low-noise filter chain 180 includes additional filter stages, then the output of the filter 220 is supplied to a subsequent variable gain amplifier 222 and filter 224. The amplification and filtering continues until the signal is supplied via connection 176 to the demodulator 178 for further processing.

Figure 3:
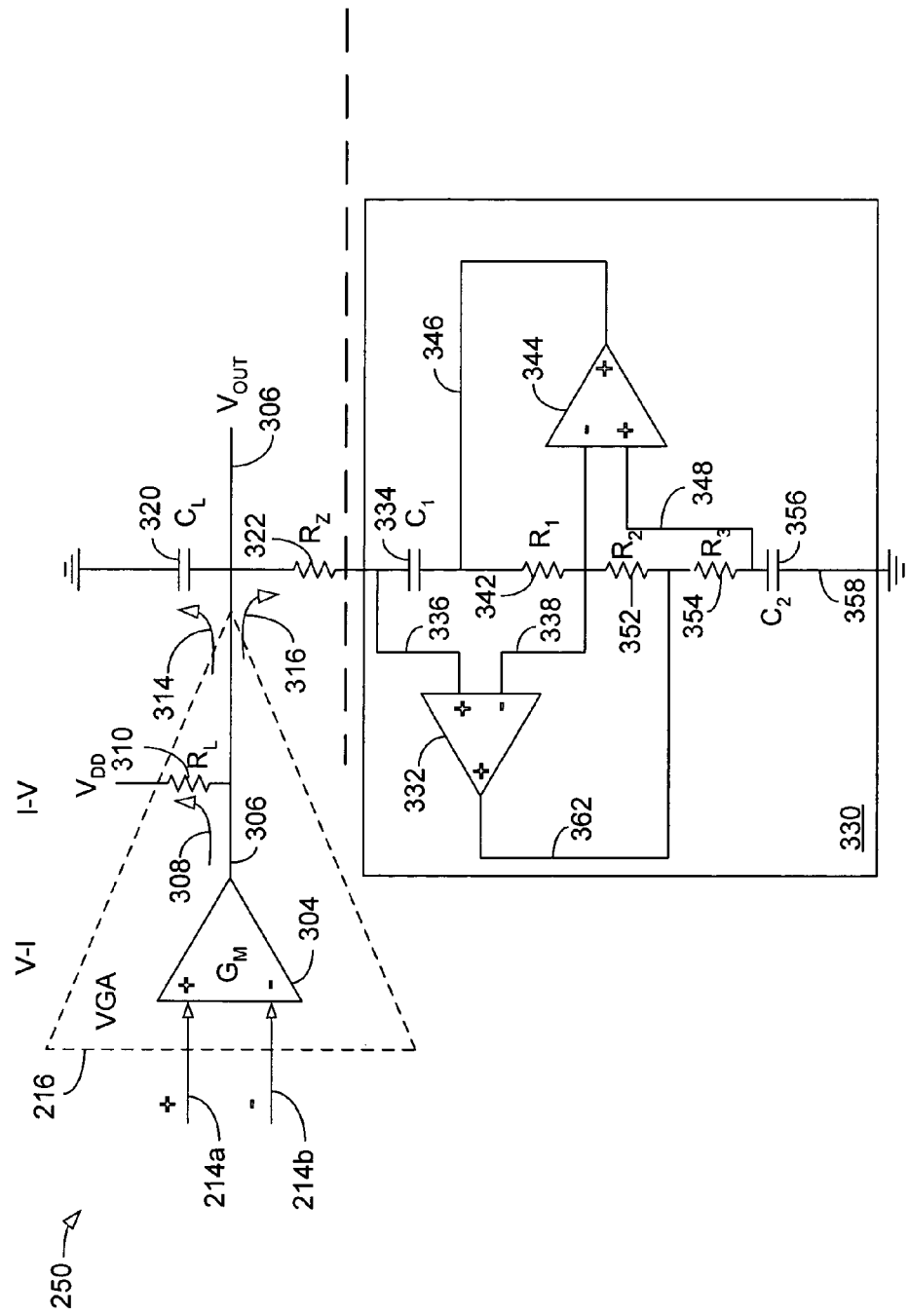
FIG. 3 is a block diagram illustrating the filter chain of FIG. 2.

FIG. 3 is a schematic diagram illustrating, in further detail, the filter stage 250 of FIG. 2. The variable gain amplifier 216 is depicted as a transconductance amplifier 304 (referred to as having the characteristic $G_M$) and a load resistance ($R_L$) 310. The load resistance 310 represents the resistive load of the transconductance amplifier 304. The transconductance amplifier 304 represents the transconductance amplification provided by the variable gain amplifier 216. The transconductance amplifier 304 receives a differential input on connections 214a and 214b. The output of the transconductance amplifier 304 on connection 306 also forms the output ($V_{OUT}$) of the filter stage 250. The transconductance amplifier 304 performs a voltage-to-current (V-I) conversion and the load resistance 310 performs a current-to-voltage (I-V) conversion. The capacitive load $C_L$ of the transconductance amplifier 304 is represented by a capacitor 320 coupled to ground.

The output of the filter stage 250 is also coupled in series to a resistance $R_Z$ 322. The resistance $R_Z$ 322 is coupled to a frequency dependent negative resistance (FDNR) 330. The frequency dependant negative resistance 330, in this example, is implemented as a general impedance converter, sometimes referred to as a "GIC." The GIC based implementation of the frequency dependent negative resistance 330 is used to implement a bi-quad filter section. The GIC based implementation of the FDNR 330 includes a pair of operational amplifiers (op-amps) 332 and 344, and related capacitances and resistances. The non-inverting input of the operational amplifier 332 is coupled via connection 336 to the node between the resistance $R_Z$ 322 and capacitance $C_1$ 334, while the inverting input of the operational amplifier 332 is coupled via connection 338 to the inverting input of the operational amplifier 344. The non-inverting input of the operational amplifier 344 is coupled to the node between the capacitance $C_2$ and the resistance $R_3$. The output of the operational amplifier 332 is coupled via connection 362 to the node between the resistances $R_2$ 352 and $R_3$ 354. The output of the operational amplifier 344 is coupled via connection 346 to the node between the capacitance $C_1$ 334 and the resistance $R_1$ 342. Alternatively, the location of the resistance $R_2$ and the capacitance $C_2$ may be reversed.

During operation of the receiver 170, the GIC based FDNR 330 has two predominant characteristics. At lower frequencies, when the received signal is at a frequency within the receive band (referred to as "in-band"), the capacitance CL 320 and the capacitance $C_1$ 334 appear as high impedances (Z). Further, any noise generated by the operational amplifiers 332 and 344 is prevented from appearing at the output 306 by the high impedance presented by the capacitance $C_1$ 334. Therefore, virtually all of the current output of the transconductance amplifier 304 travels through the load resistance $R_L$ as indicated by arrow 308 to appear at the output 306 with virtually no noise contributed by the FDNR 330.

At higher frequencies, when the received signal is at a frequency that is outside of the receive band (referred to as "out-of-band"), the impedance of the capacitances $C_1$ 334 and $C_L$ 320 is less than when the received signal occurs in-band. At an out-of-band frequency, a portion of the current in the signal is lost, as indicated by arrows 314 and 316, because the lower impedance of the capacitance $C_L$ 320 and $C_1$ 334 allows current to flow through those capacitances. Because of the reduced impedance of the capacitances $C_L$ 320 and $C_1$ 334 any noise generated by the GIC based FDNR 330 is allowed to appear at the output 306. However, because this only occurs when the receive signal is out-of-band, the noise generated by the operational amplifiers 332 and 344 may appear at the output 306, but has no negative affect on the output signal.

Any noise generated by the FDNR 330 is blocked by the high impedance presented by the capacitance $C_1$ 334 at lower in-band frequencies but appears at the output 306 at higher out-of-band frequencies, but, at out-of-band frequencies, the noise has no negative affect on the performance of the filter stage 250. Because noise is prevented from appearing at the output 306 at in-band frequencies, and because noise at the output 306 has no negative affect at out-of-band frequencies, small capacitance values, and, therefore, physically small components may be used to form the capacitances, thus significantly reducing the amount of space consumed by the filter stage 250.

The values of the components within the GIC based FDNR 330 are chosen to realize the desired filter poles, and the value of the resistance $R_Z$ 322 is chosen to realize the desired filter zeros, such that a "bi-quad" filter may be realized using the GIC based frequency dependent negative resistance 330.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for filtering a receive signal in a wireless receiver, comprising:
    providing a received signal to an amplifier; and
    filtering the received signal using a circuit comprising a single frequency dependent negative resistance configured to realize a bi-quad filter electrically isolated from an input of the amplifier such that noise contributed by the circuit is blocked from an output of the amplifier at a first frequency, wherein filtering at the first frequency is performed via a single voltage-to-current conversion and a single current-to-voltage conversion.

2. The method of claim 1, wherein noise contributed by the circuit is passed to the output of the amplifier only at a frequency other than the first frequency.

3. The method of claim 1, wherein the circuit comprises a frequency dependent negative resistance implemented using a general impedance converter.

4. The method of claim 3, wherein noise generated by the general impedance converter is blocked from the output of the amplifier at the first frequency.

5. The method of claim 4, wherein the first frequency is the in-band receive frequency.

6. A low-noise filter for a wireless receiver, comprising:
    an amplifier; and
    a circuit comprising a single frequency dependent negative resistance implemented using a general impedance convener to realize a bi-quad filter electrically isolated from the amplifier input, the circuit configured such that noise generated by the circuit is prevented from appearing on a received signal at a first frequency, wherein the amplifier and the frequency dependent negative resistance perform a voltage-to-current conversion and a current-to-voltage conversion, respectively at a first frequency.

7. The low-noise filter of claim 6, wherein the general impedance converter further comprises:
    a pair of operational amplifiers arranged such tat a non-inverting input of a first amplifier is coupled to an inverting input of a second operational amplifier; and
    at least one capacitance configured to prevent noise generated by the pair of operational amplifiers from appearing at an output of the amplifier at the first frequency.

8. The low-noise filter of claim 7, wherein the first frequency is the in-band receive frequency.

9. The low-noise filter of claim 8, wherein noise generated by the pair of operational amplifiers appears at the output of the amplifier at a second frequency.

10. The low-noise filter of claim 9, wherein the second frequency is an out-of-band receive frequency.

11. A portable transceiver, comprising:
    a modulator configured to receive and modulate a data signal;
    an upconverter configured to receive the modulated data signal and provide a radio frequency (RF) signal;
    a transmitter configured to transmit the RF signal; and
    a direct conversion receiver including an amplifier and a filter, the filter comprising a single frequency dependent negative resistance implemented using a general impedance converter to realize a bi-quad filter electrically isolated from the amplifier input and configured such that noise generated by the filter is prevented from appearing on a received signal at a first frequency, wherein the amplifier and the frequency dependent negative resistance perform a single voltage-to-current conversion and a single current-to-voltage conversion.

12. The portable transceiver of claim 11, wherein the general impedance converter further comprises:
    a pair of operational amplifiers arranged such that a non-inverting input of a first amplifier is coupled to an inverting input of a second operational amplifier; and
    at least one capacitance configured to prevent noise generated by the pair of operational amplifiers from appearing at an output of the amplifier stage at a first frequency.

13. The portable transceiver of claim 12, wherein the first frequency is the in-band receive frequency.

14. The portable transceiver of claim 13, wherein noise generated by the pair of operational amplifiers appears at the output of the amplifier stage at a second frequency.

15. The portable transceiver of claim 14, wherein the second frequency is an out-of-band receive frequency.

16. A portable transceiver, comprising:
    means for modulating a data signal;
    means for upconverting the modulated data signal and provide a radio frequency (RF) signal;
    means for transmitting the RF signal;
    means for converting a received signal to a baseband signal; and
    means for filtering the baseband signal so that noise generated by the filter means is prevented from appearing on the received signal at a first frequency, the means for filtering comprising a single frequency dependent negative resistance configured to realize a bi-quad filter electrically isolated from an input of the amplifier, wherein the means for filtering performs a single voltage-to-current conversion and a single current-to-voltage conversion.

17. The portable transceiver of claim 16, wherein the first frequency is the in-band receive frequency.

18. The portable transceiver of claim 17, wherein noise generated by the filter means appears on the received signal at a second frequency.

19. The portable transceiver of claim 18, wherein the second frequency is the out-of-band receive frequency.

* * * * *